(12) United States Patent
Annunziata et al.

(10) Patent No.: US 8,741,664 B2
(45) Date of Patent: Jun. 3, 2014

(54) MAGNETIC TUNNEL JUNCTION SELF-ALIGNMENT IN MAGNETIC DOMAIN WALL SHIFT REGISTER MEMORY DEVICES

(75) Inventors: Anthony J. Annunziata, Stamford, CT (US); Michael C. Gaidis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/555,368

(22) Filed: Jul. 23, 2012

(65) Prior Publication Data
US 2014/0004625 A1 Jan. 2, 2014

Related U.S. Application Data

(63) Continuation of application No. 13/539,550, filed on Jul. 2, 2012.

(51) Int. Cl.
*H01L 21/00* (2006.01)
(52) U.S. Cl.
USPC ............ 438/3; 365/66; 365/158; 365/171; 365/173; 257/E29.323
(58) Field of Classification Search
USPC ......... 438/3; 257/421, 423, E29.323; 365/65, 365/66, 80, 81, 87, 130, 158, 171, 173; 977/933
See application file for complete search history.

(56) References Cited

U.S. PATENT DOCUMENTS

| | | | |
|---|---|---|---|
| 6,834,005 B1 | 12/2004 | Parkin | |
| 6,920,062 B2 | 7/2005 | Parkin | |
| 6,970,379 B2 | 11/2005 | Parkin | |
| 7,067,330 B2 | 6/2006 | Min et al. | |
| 7,145,796 B2 | 12/2006 | Fukuzumi et al. | |
| 7,169,623 B2 * | 1/2007 | Ditizio | 438/3 |
| 7,236,386 B2 | 6/2007 | Parkin | |
| 7,514,271 B2 | 4/2009 | Gaidis et al. | |
| 7,710,769 B2 * | 5/2010 | Cowburn et al. | 365/171 |
| 7,957,175 B2 | 6/2011 | Lim et al. | |
| 8,023,305 B2 | 9/2011 | Gaidis et al. | |
| 8,040,724 B2 | 10/2011 | Suzuki et al. | |
| 8,120,127 B2 | 2/2012 | Nagahara et al. | |
| 8,143,682 B2 * | 3/2012 | Bratkovski et al. | 257/421 |
| 8,194,436 B2 | 6/2012 | Fukami et al. | |
| 8,279,653 B2 | 10/2012 | Tsai et al. | |
| 8,467,222 B2 | 6/2013 | Shen et al. | |

(Continued)

OTHER PUBLICATIONS

S. Parkin et al., "Magnetic Domain-Wall Racetrack Memory," Science, vol. 320, No. 5873, Apr. 11, 2008, pp. 190-194.

*Primary Examiner* — Leonard Chang
(74) *Attorney, Agent, or Firm* — Cantor Colburn LLP; Vazken Alexanian (57) ABSTRACT

A method of fabricating a self-aligning magnetic tunnel junction the method includes patterning a lithographic strip on a second magnetic material deposited on a first magnetic material that is disposed on a substrate, forming a top magnetic strip by etching an exposed portion of the second magnetic material, patterning a nanowire and a magnetic reference layer island over the substrate and forming the nanowire and the magnetic reference layer island by etching an exposed portion of the first magnetic layer and an exposed portion of the top magnetic strip, wherein an interface between the magnetic nanowire and the magnetic reference layer island is an magnetic tunnel junction aligned with a width of the nanowire.

2 Claims, 7 Drawing Sheets

(56) References Cited

U.S. PATENT DOCUMENTS

| | | |
|---|---|---|
| 2005/0023581 A1* | 2/2005 | Nuetzel et al. ............... 257/295 |
| 2005/0258469 A1* | 11/2005 | Guo ............................. 257/314 |
| 2007/0155026 A1* | 7/2007 | Ho et al. ......................... 438/3 |
| 2008/0278998 A1* | 11/2008 | Cowburn et al. ............. 365/171 |
| 2010/0128510 A1 | 5/2010 | Cowburn |
| 2011/0163402 A1 | 7/2011 | Fukami et al. |
| 2012/0244639 A1 | 9/2012 | Ohsawa et al. |

* cited by examiner

MAGNETIC TUNNEL JUNCTION SELF-ALIGNMENT IN MAGNETIC DOMAIN WALL SHIFT REGISTER MEMORY DEVICES

CROSS REFERENCE TO RELATED APPLICATIONS

This application is a continuation of U.S. patent application Ser. No. 13/539,550 filed Jul. 2, 2012, the contents of which are incorporated herein by reference thereto.

BACKGROUND

The present invention relates to magnetic domain wall shift register memory devices, and more specifically, to a magnetic domain wall shift register memory device utilizing a magnetic tunnel junction (MTJ) that is self-aligned to the nanowire that comprises the magnetic domain wall shift register.

Fabrication of a magnetic domain wall shift register memory device requires aligning one or multiple MTJs to one or multiple magnetic nanowires. In the fabrication process, accurate alignment between the MTJ and the magnetic nanowire is crucial to obtaining a properly functioning device.

Existing racetrack memory device designs utilize an integrated MTJ, where the nanowire acts as the free magnetic layer, and the reference magnetic layer is patterned in a separate lithography step from the nanowire. This makes alignment and processing difficult, and often necessitates an MTJ that is narrower than the nanowire. Rounding also occurs due to optical effects of having a small hole versus a line in the lithography masks. As such, much process optimization, including trial-and-error, is necessary during fabrication to properly align the MTJ on the nanowire.

SUMMARY

Exemplary embodiments include a method of fabricating a self-aligning magnetic tunnel junction the method including patterning a lithographic strip on a second magnetic material deposited on a first magnetic material that is disposed on a substrate, forming a top magnetic strip by etching an exposed portion of the second magnetic material, patterning a nanowire and a magnetic reference layer island over the substrate and forming the nanowire and the magnetic reference layer island by etching an exposed portion of the first magnetic layer and an exposed portion of the top magnetic strip, wherein an interface between the magnetic nanowire and the magnetic reference layer island is an magnetic tunnel junction aligned with a width of the nanowire.

Additional exemplary embodiments include a method of fabricating a self-aligning magnetic tunnel junction the method including forming a substrate, defining a nanowire on the substrate, the nanowire being a first magnetic material and defining a magnetic reference layer island on the nanowire, the magnetic reference layer island being a second magnetic material, wherein an interface between the nanowire and the magnetic reference layer island is an magnetic tunnel junction aligned with a width of the nanowire.

Further exemplary embodiments include a method of fabricating a self-aligning magnetic tunnel junction, the method including patterning a nanowire on a substrate and patterning a magnetic tunnel junction on a portion of the nanowire, wherein the magnetic tunnel junction island is self-aligned on the portion of the nanowire.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In exemplary embodiments, the systems and methods described herein include a magnetic domain wall shift register memory device, and a fabrication method thereof, utilizing a self-aligned MTJ, which reduces the accuracy needed in alignment and results in a higher yield and more reproducible device. The exemplary self-alignment systems and methods eliminate alignment mismatch and/or overlap errors when aligning one or multiple MTJs to one or multiple magnetic nanowires. In exemplary embodiments, a single extended lithographic patterning structure can be implemented to fabricate multiple independent magnetic tunnel junctions self-aligned to multiple independent magnetic nanowires.

Figure 1:
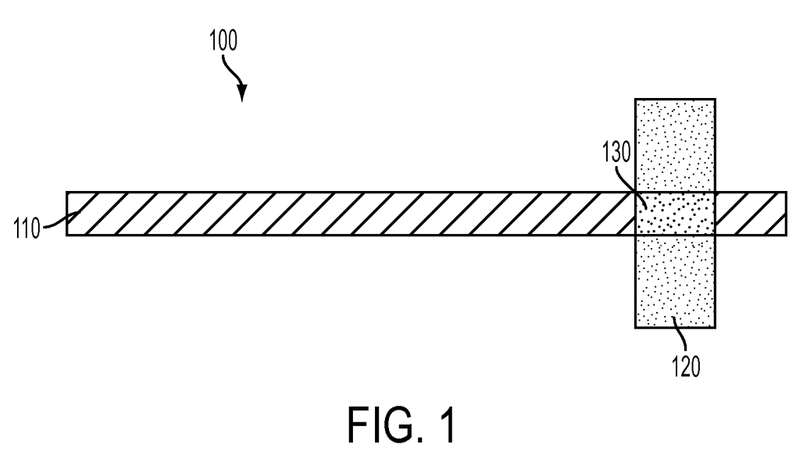
FIG. 1 illustrates a top plan view of an exemplary magnetic domain shift register memory device design.

FIG. 1 illustrates a top plan view of an exemplary magnetic domain shift register memory device design 100. As described herein, an exemplary magnetic domain shift register memory device is fabricated implementing a self-aligned MJT readout. The design 100 demonstrates that a nanowire 110 can be fabricated by standard lithographic techniques, and be overlayed substantially perpendicular with lithographic strip 120 to define an overlap region 130. It can be appreciated that the overlay region 130 is thus self-aligned with the nanowire 110. As such, with further lithographic techniques, an MTJ can be fabricated within the overlay region 130 and thus also be self-aligned with the nanowire 110. In this way, the need to dispose a pre-existing MTJ structure onto the nanowire 110 is eliminated thereby eliminating the inaccuracies involved with aligning MTJs as in the prior art.

Figure 2:
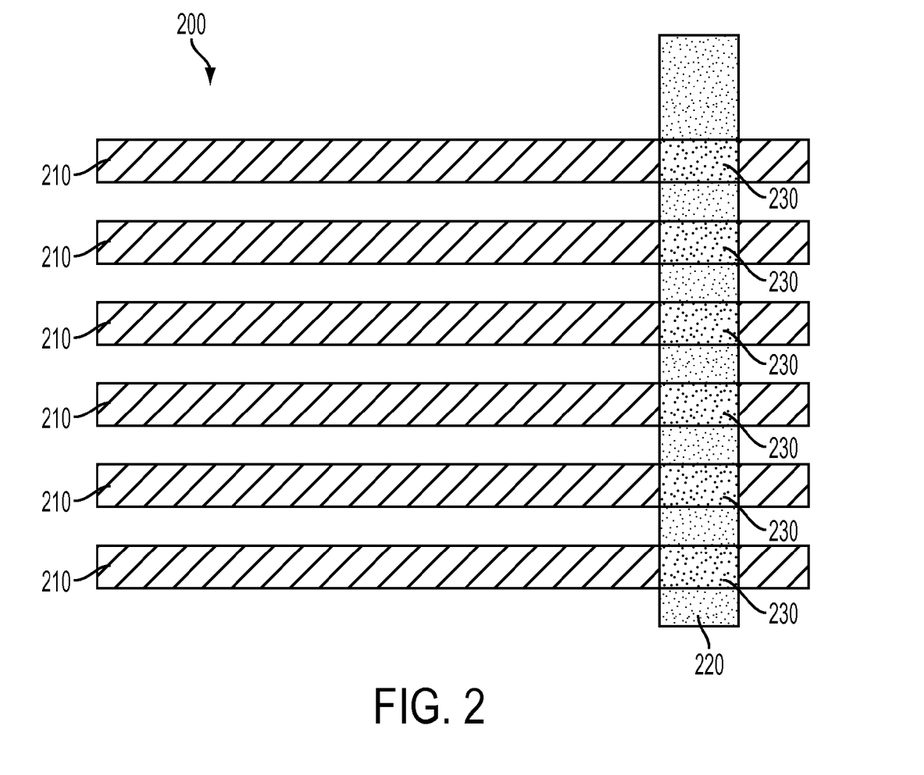
FIG. 2 illustrates a top plan view of an exemplary multiple magnetic domain shift register memory device design.

FIG. 2 illustrates a top plan view of an exemplary multiple magnetic domain shift register memory device design 200. As described herein, an exemplary magnetic domain shift register memory device is fabricated implementing a self-aligned MJT readout. The design 200 demonstrates that multiple nanowires 210 can be fabricated by standard lithographic techniques, and be overlayed substantially perpendicular with lithographic strip 220 to define overlap regions 230. It can be appreciated that the overlay regions 230 are thus self-aligned with the respective nanowires 210. As such, with further lithographic techniques, multiple MTJs can be fabricated within the overlap regions 230 and thus also be self-aligned with the nanowires 210. In this way, the need to dispose individual pre-existing MTJ structures onto the nanowires 210 is eliminated thereby eliminating the inaccuracies involved with aligning MTJs as in the prior art.

Figure 3:
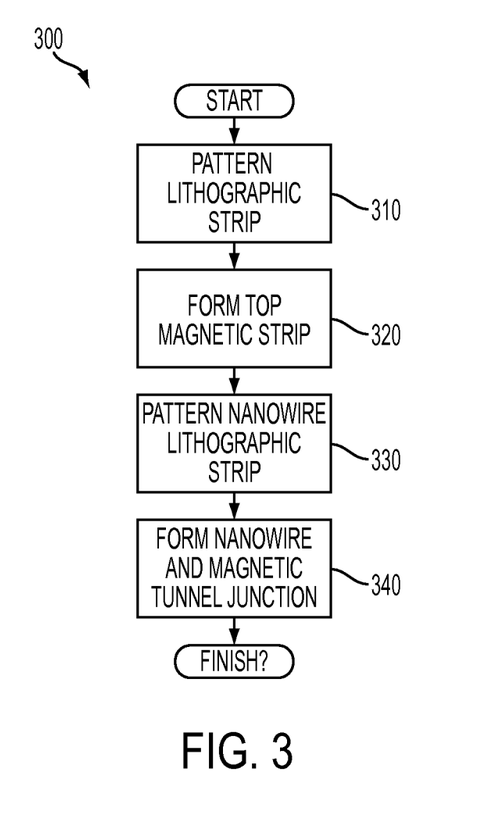
FIG. 3 illustrates a flow chart for a method of MTJ self-alignment in magnetic domain wall shift register memory devices in accordance with exemplary embodiments.
Figure 4:
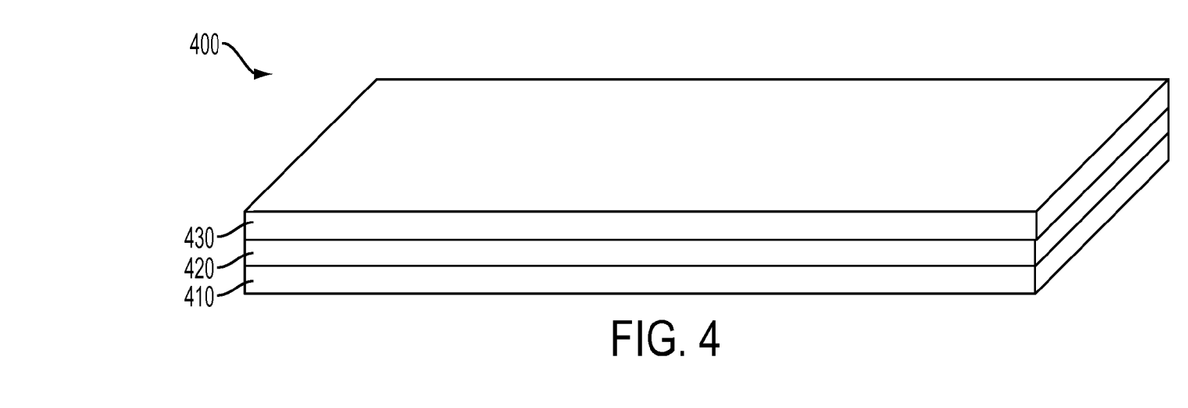
FIG. 4 illustrates an exemplary starting structure onto which the exemplary self-aligning MTJs in magnetic domain wall shift register memory devices can be formed.

The magnetic domain shift register memory device designs 100, 200 demonstrate implementation of MTJ self-alignment in magnetic domain wall shift register memory devices. FIG. 3 illustrates a flow chart for a method 300 of MTJ self-alignment in magnetic domain wall shift register memory devices in accordance with exemplary embodiments. FIG. 4 illustrates an exemplary starting structure 400 onto which the exemplary self-aligning MTJs in magnetic domain wall shift register memory devices can be formed. The structure includes a substrate 410, onto which a first magnetic layer 420 is disposed. A second magnetic layer 430 is further disposed on the first magnetic layer 420.

Figure 5:
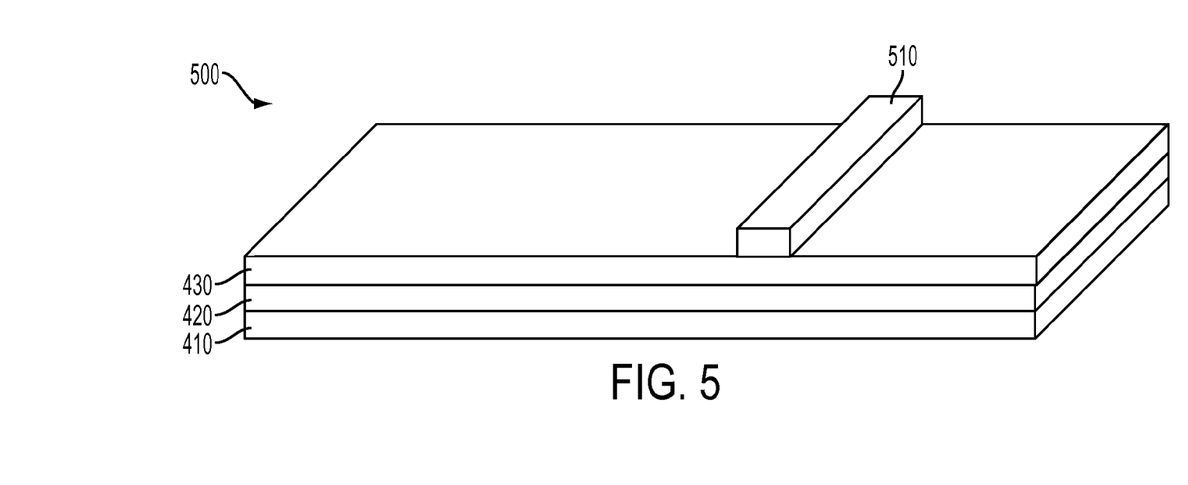
FIG. 5 illustrates an intermediate structure in which a lithographic strip is patterned on a magnetic layer.
Figure 6:
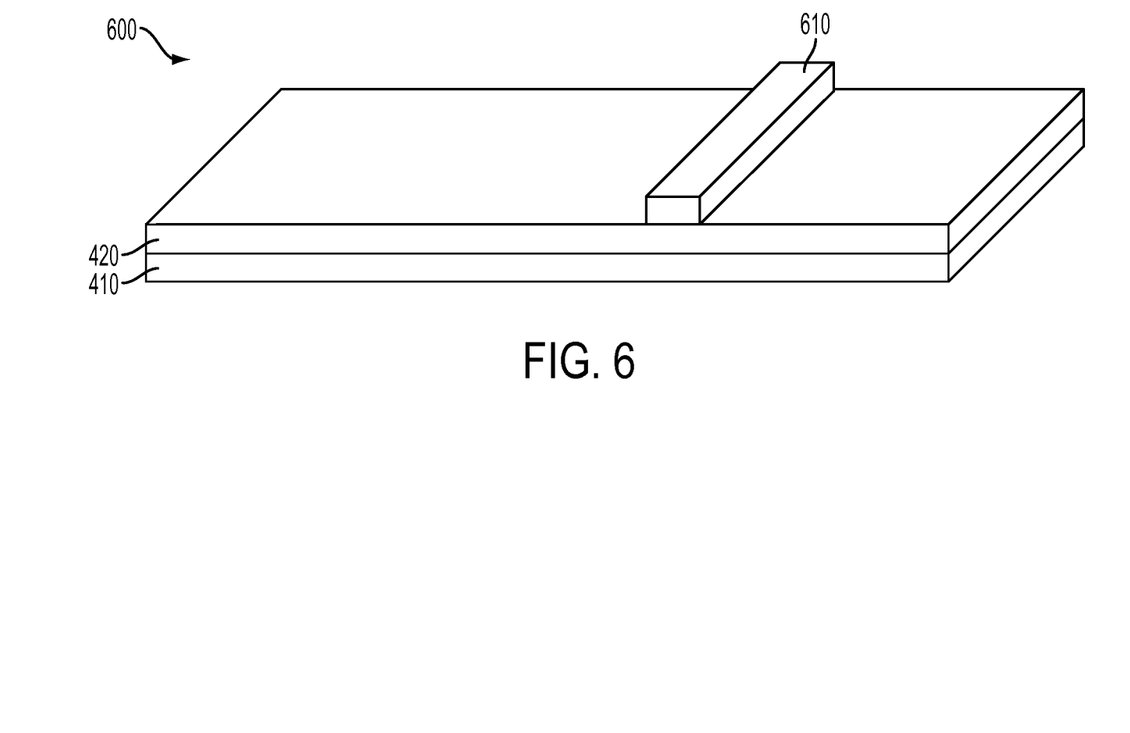
FIG. 6 illustrates an intermediate structure in which a top magnetic strip is formed on a magnetic layer.
Figure 7:
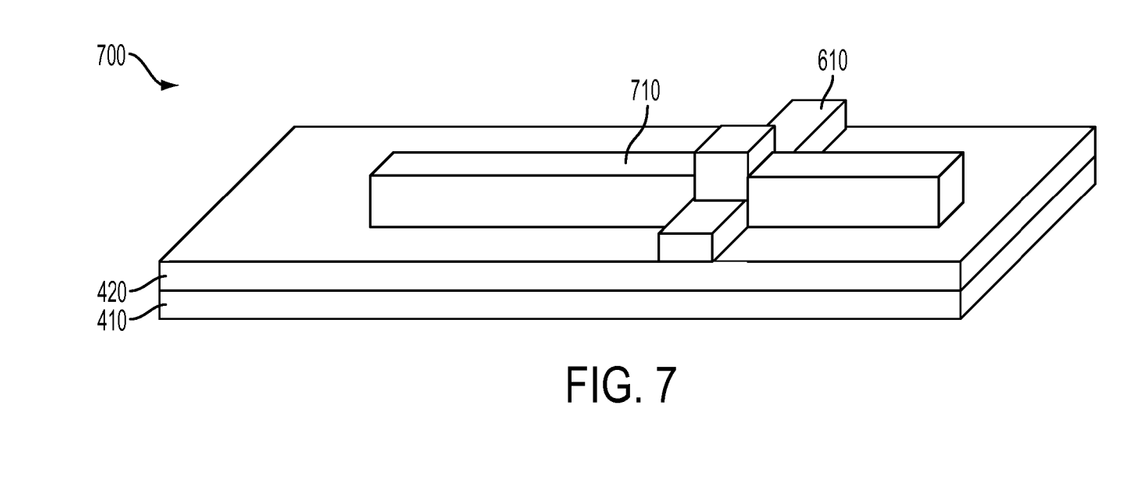
FIG. 7 illustrates an intermediate structure in which a second lithographic strip is patterned on a magnetic layer overlapping the top magnetic strip.
Figure 8:
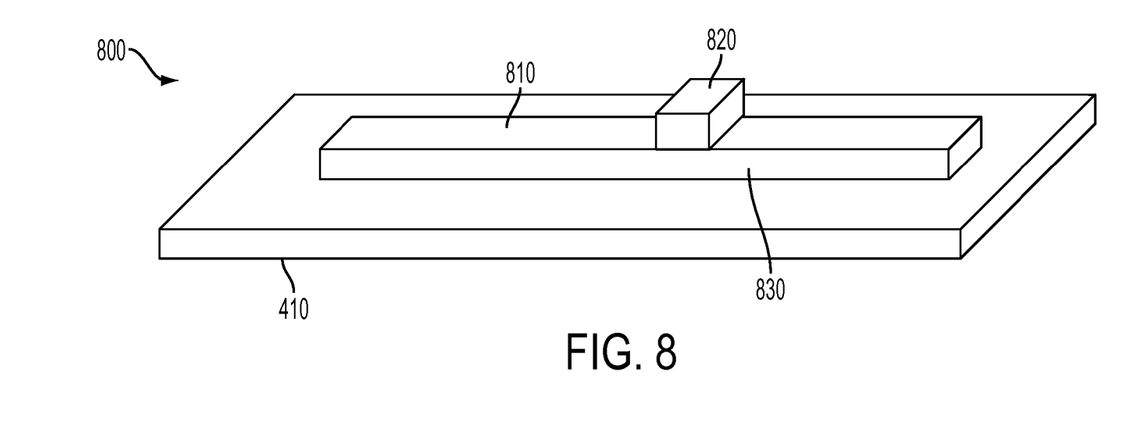
FIG. 8 illustrates a final structure having an exemplary self-aligned MTJ disposed on a nanowire.
Figure 9:
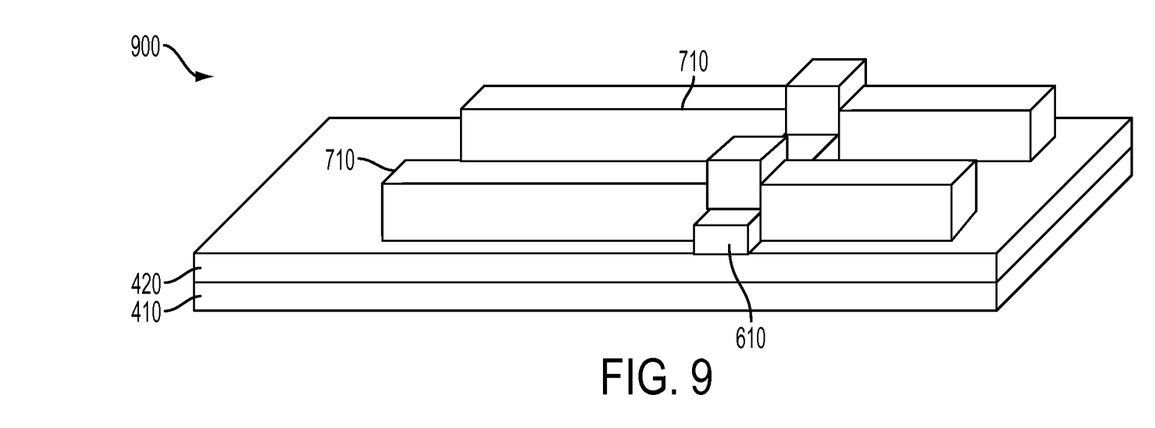
FIG. 9 illustrates an intermediate structure in which multiple lithographic strips are patterned on a magnetic layer overlapping the top magnetic strip.
Figure 10:
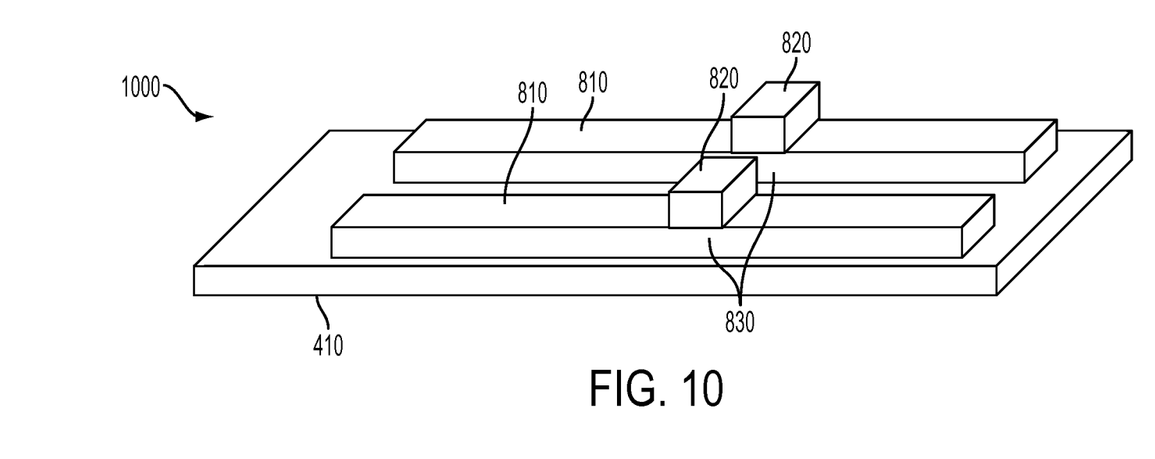
FIG. 10 illustrates a final structure having multiple exemplary self-aligned MTJs disposed on multiple nanowires.

Referring again to FIG. 3, at block 310 a lithographic strip is patterned on the second magnetic layer 430. FIG. 5 illustrates an intermediate structure 500 in which the lithographic strip is patterned on the second magnetic layer 430 with a photoresist pattern 510. Any suitable lithographic technique can be implemented to pattern the lithographic strip. At block 320, the top magnetic strip 610 (see FIG. 6) is formed by etching the surrounding exposed portions of the second magnetic layer 430. The patterned photoresist acts as a mask for subtractive etching of the second magnetic layer 430. This subtractive etch stops on the interface between the two magnetic layers 420, 430. Any suitable etching techniques such as, but not limited to, wet chemical etching and RIE are implemented. FIG. 6 illustrates an intermediate structure 600 in which a top magnetic strip 610 is formed on the first magnetic layer 420. At block 330, a nanowire and MTJ island are patterned over the substrate 410. FIG. 7 illustrates an intermediate structure 700 in which the top magnetic strip and nanowire resist strip 710 are patterned on the first magnetic layer 420. FIG. 9 illustrates an intermediate structure 900 in which a top magnetic strip and multiple nanowire lithographic strips are patterned on the first magnetic layer 420. Any suitable lithographic technique can be implemented to pattern the top magnetic strip and the nanowire lithographic strips. At block 340, the nanowire 810 and MTJ island 820 (see FIG. 8) are formed by etching the surrounding exposed portions of the first magnetic layer 420 and the exposed portions of the top magnetic strip 610. The patterned photoresist acts as a mask for subtractive etching of the first magnetic layer 420 and the exposed part of the top magnetic strip 610 patterned from the second magnetic layer 430. The etching process retains the MTJ island 820 from the second magnetic layer 430 atop the nanowire 810 from the first magnetic layer 420. Any suitable etching techniques such as, but not limited to, wet chemical etching and RIE are implemented. FIG. 8 illustrates a final structure 800 having an exemplary self-aligned MTJ 820 disposed on the nanowire 810, which can support a magnetic domain wall shift register. FIG. 10 illustrates a final structure 1000 having multiple exemplary self-aligned MTJs 820 disposed on multiple nanowires 810, which can support multiple magnetic domain wall shift registers. The interface between the MTJ island 820 and the nanowire 810 forms an MTJ 830 that precisely covers the width of the MTJ island 820 and the nanowire 810.

It can be appreciated that other fabrication steps are contemplated to complete the devices (e.g., the devices 100, 200) described herein. For example, patterning of the MTJ introduces device-to-device isolation in the counter-electrode, but maintains electrical continuity between all devices in the base electrode. Often negligible in fully integrated wafers, the resistance of the base electrode after MTJ patterning is germane to the short loop. The use of a continuous planar base electrode incurs additional measurement error at final electrical testing if the base electrode possesses a high sheet resistance. Subject to the constraint of emulating the stack used in fully functional wafers, the magnetic stack of the short loop will therefore include thick or low resistivity films beneath the tunnel barrier. A commonly used, straightforward approach to patterning the MTJs is through the use of a conducting hard mask. The conducting mask is later utilized as a self-aligned stud bridging the conductive MT wiring to the active magnetic films in the device. Such a processing scheme is among the simplest and fastest ways of creating and contacting the MTJs, making it an ideal approach for use in the short loop. Choices for the hard mask are numerous, with necessary characteristics being etchability and a resistance that is negligible when compared with MTJ resistance. Refractory materials commonly used in the semiconductor industry such as Ta, TaN, and TiN are suitable as masks for MTJ patterning. The MTJ shapes are defined in the hard mask by transfer from a first photomask level in a process such as the following: apply resist/expose and develop/reactive ion etching ERIE) through hard mask/strip resist. The pattern is further transferred downward to penetrate to (or through) the tunnel barrier, leaving behind a low-resistance base layer which covers the entire wafer.

Other processing steps can include encapsulating the devices in a dielectric. The encapsulation protects the devices while at the same time forming the environment in which the attachment of contacts can be implemented. The choice of encapsulation is determined from three requirements: a) must not damage the devices 100; b) it must adhere well to the substrate; and c) it should closely emulate the interlayer dielectrics (ILDs) that would be used in a fully integrated wafer processes. For example, damage to the MTJs can arise from chemical interactions and thermal stress. Standard semiconductor-industry dielectrics typically are deposited or cured at temperatures around 400 C., whereas degradation in submicron MTJs can set in at temperatures below 350 C. Thus, a major challenge to the integrator of the shift register devices is the development and utilization of suitable low temperature dielectrics. Adhesion of the dielectric to the substrate can be particularly problematic given the characteristics of the magnetic films being used. Noble-metal-containing antiferromagnets can be particularly difficult to adhere to, and, if exposed by the etching used for MU patterning, can require specialized surface-cleaning or surface-preparation techniques to promote adhesion to the encapsulating dielectric. The dielectric thickness is chosen such that it will be thick enough to provide the environment for the wiring level above the MTJs.

Other semiconducting fabrication processes can include planarization. To facilitate industry standard damascene copper wiring, the wafers generally undergo a gentle dielectric CMP process at this stage. The purpose of the CMP is to remove topography from the surface that is caused by the underlying MTJs. This step is also the first check of the adhesion of the dielectrics to the underlying metal films, as well as the cohesion of the metal films to each other. If the encapsulating dielectrics are suitably planarizing in their deposition, this CMP planarization step can be eliminated for faster turnaround time and potentially higher yield.

After completion of the steps for the device development (e.g., layer formation, patterning, and encapsulation), the wiring is instituted in the simplest manner consistent with the available tooling. Relying on well-established semiconductor-industry techniques, a photomask defined trench is etched into the dielectric with RIE, to be filled with a liner and high-conductivity copper. The depth of the trench is sufficient to expose a portion of the conducting hard-mask stud (the counter-electrode), while not so deep as to create a short circuit to the planar base electrode. Endpointing during the trench RIE can facilitate the proper choice of trench depth even for relatively thin hard-mask films. After the trench etching and a suitable cleaning step, the wiring liner film is deposited, along with a thin copper seed layer. This deposition is followed by the electroplating of copper to completely fill the trench and provide enough overburden so that the ensuing CMP step will planarize the metal coincident with the surface of the dielectric. This final CMP step can be aggressive enough to cause shear failure of the films on the wafers, and care must be taken to prevent such delamination. A post-polish cleaning of the wafers is the final preparation step before electrical testing.

As such, it can be appreciated that the self-alignment systems and methods described herein eliminate alignment mismatch and/or overlap errors when aligning one or multiple MTJs to one or multiple magnetic nanowires. In addition, a single extended lithographic pattering structure can be used to fabricate multiple independent MTJs self-aligned to multiple independent magnetic nanowires.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of fabricating a self-aligning magnetic tunnel junction (MTJ), the method comprising:
    forming a substrate;
    defining a nanowire on the substrate, the nanowire being a first magnetic material; and
    defining a magnetic reference layer island on the nanowire, the magnetic reference layer island being a second magnetic material, wherein an overlap region is formed between the nanowire and the second magnetic material;
    wherein an interface between the nanowire and the magnetic reference layer island is an MTJ aligned with a width of the nanowire, the MTJ being formed in the overlap region;
    wherein the substrate is a material different from the first magnetic material and the second magnetic material, and the first magnetic material is different from the second magnetic material; and
    wherein the magnetic reference layer island is formed by etching a portion of the second magnetic material and retaining the first magnetic material.

2. The method as claimed in claim 1 wherein the nanowire is formed by etching a portion of the first magnetic material and a portion of the second magnetic material.

* * * * *